United States Patent [19]

Loong et al.

[11] Patent Number: 5,478,679
[45] Date of Patent: Dec. 26, 1995

[54] HALF-TONE SELF-ALIGNING PHASE SHIFTING MASK

[75] Inventors: Wen-An Loong; Shyi-Long Shy, both of Hsin-Chu; Hong-Tsz Pan, Chang-Hua; Ming-Tzong Yang, Hsin-Chu; Guey-Chi Guo, Hsin-Chu; Yueh-Lin Chou, Hsin-Chu, all of Taiwan

[73] Assignee: United Microelectronics Corporation, Hsinchu, China

[21] Appl. No.: 344,006

[22] Filed: Nov. 23, 1994

[51] Int. Cl.⁶ ............................................. G03F 9/00
[52] U.S. Cl. ............................... 430/5; 430/321; 430/322
[58] Field of Search ......................... 430/5, 321, 322; 378/34, 35

[56] References Cited

U.S. PATENT DOCUMENTS

| | | | |
|---|---|---|---|
| 5,045,417 | 9/1991 | Okamoto | 430/5 |
| 5,190,836 | 3/1993 | Nakagawa et al. | 430/5 |
| 5,194,344 | 3/1993 | Cathey, Jr. et al. | 430/5 |
| 5,194,345 | 3/1993 | Rolfson | 430/5 |
| 5,194,346 | 3/1993 | Rolfson et al. | 430/5 |
| 5,208,125 | 5/1993 | Lowrey et al. | 430/5 |
| 5,217,830 | 6/1993 | Lowrey | 430/5 |
| 5,225,035 | 7/1993 | Rolfson | 156/643 |
| 5,288,569 | 2/1994 | Lin | 430/5 |

OTHER PUBLICATIONS

"Lithography's Leading Edge, Part 1: Phase Shift Technology", published in Semiconductor Technology International, Feb. 1992, pp. 42–47.

Primary Examiner—S. Rosasco
Attorney, Agent, or Firm—George O. Saile

[57] ABSTRACT

This invention describes the fabrication and use of a self-aligning phase shifting mask comprised of phase shifting material formed over a patterned layer of half-tone or partially transmitting material. The interaction of light passing through the phase shifting and partially transmitting areas of the mask, the phase shifting only areas of the mask, and the non phase shifting transparent areas of the mask provides greater image resolution and depth of focus tolerance than other lithography methods including other known phase shifting techniques.

20 Claims, 3 Drawing Sheets

HALF-TONE SELF-ALIGNING PHASE SHIFTING MASK

BACKGROUND OF THE INVENTION (1) Field of the Invention

The invention relates to the use of a phase shifting mask to improve resolution in the fabrication of sub-micron integrated circuits and more particularly to the use of a self aligning mask with phase shifting regions, half-tone or partially transmitting regions and non phase shifting transparent regions.

(2) Description of the Related Art

As optical lithography advances to 0.5 to 0.35 microns and below new technologies are needed to improve the resolution of the imaging lens. Phase-shifting photomasks have been used to improve resolution as well as depth of focus. Phase shifting processes are described in U.S. Pat. Nos. 5,045,417 to Okamoto, 5,194,344 to Cathey Jr. et al, 5,194,345 to Rolfson, 5,194,346 to Rolfson et al, 5,208,125 to Lowrey et al, 5,217,830 to Lowrey, and 5,225,035 to Rolfson. The methods used in these phase shifters usually use an opaque material in conjunction with a phase shifting material. U.S. Pat. No. 5,190,836 to Nakagawa et al, describes a phase shifter using reflection techniques.

"LITHOGRAPHY'S LEADING EDGE, PART 1: PHASE-SHIFT TECHNOLOGY," published in Semiconductor International, February 1992, pages 42–47 describes phase shift techniques and includes a rim type phase shifter in the Table on page 45. This rim type phase shifter uses an opaque material in conjunction with a phase shifting material.

This invention uses phase shifters using a partially transmitting material with a phase shifting material to provide improved image resolution and depth of focus. This improved image resolution and depth of focus is important as linear dimensions used in integrated circuit technology call for improved resolution and depth of focus.

SUMMARY OF THE INVENTION

It is the principal object of the invention to provide a means for achieving improved image resolution and depth of focus tolerance in integrated circuit fabrication using a phase shifting photomask which combines phase shifting techniques with partially transmitting mask regions. This phase shifting photomask utilizes a partially transmitting material in combination with phase shifting material to achieve improved definition at the pattern edge when the pattern is projected on the surface of an integrated circuit wafer. In addition the combination of phase shifted and partially transmitted light also improves the depth of focus.

It is a further objective of this invention to provide a method of forming the phase shifting photomask with areas of partially transmitting or half-tone material. The formation of the mask utilizes self aligning patterns which aid in achieving the improved image resolution.

These objectives are achieved by forming a phase shifting mask with a patterned layer of phase shifting material deposited over a patterned layer of half-tone or partially transmitting material. The pattern of the phase shifting material is used as a mask for forming the pattern of the half-tone material thereby making the pattern self aligning. The half-tone material is over etched so that the pattern edge of the phase shifting material extends beyond the pattern edge of the half-tone material. This combination of phase shifting material extending beyond the pattern edge of the half-tone material provides a depth of focus or defocus tolerance of 1.6 microns which is at least a 60% increase over that achieved with other phase shifting techniques. In addition to improved depth of focus the image resolution is improved and the light power required is moderate at 21.5 mW/cm$^2$.

DESCRIPTION OF THE PREFERRED EMBODIMENTS

Figure 1:
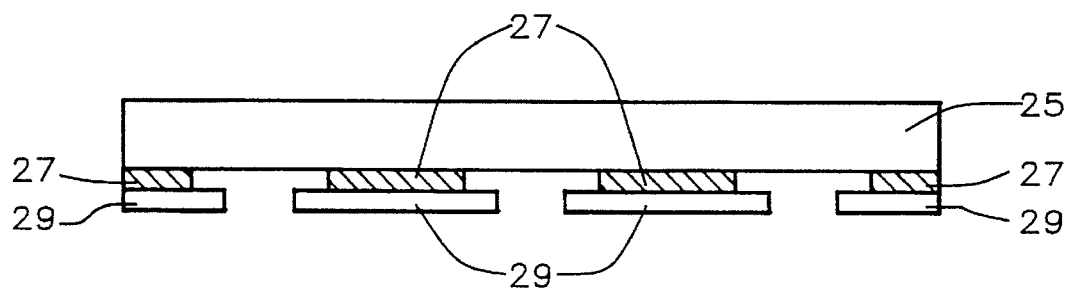
FIG. 1 shows a cross sectional view of the self-aligned phase shifting mask showing the transparent substrate, the half-tone material, and the phase shifting material.
Figure 2:
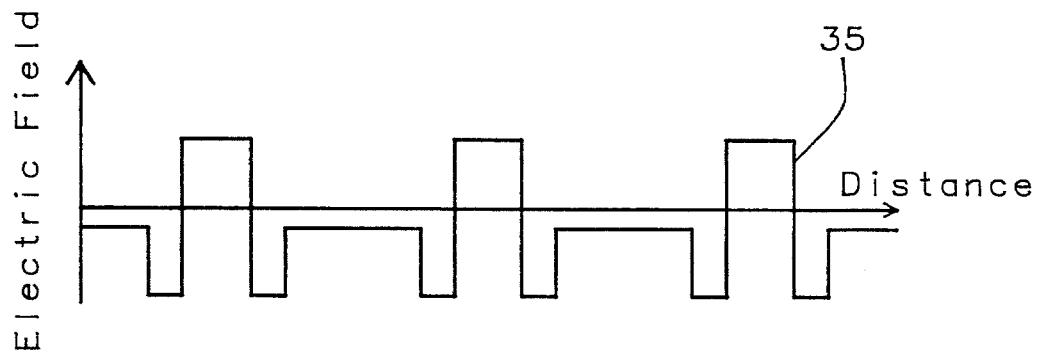
FIG. 2 shows the electric field of the light at the mask.
Figure 3:
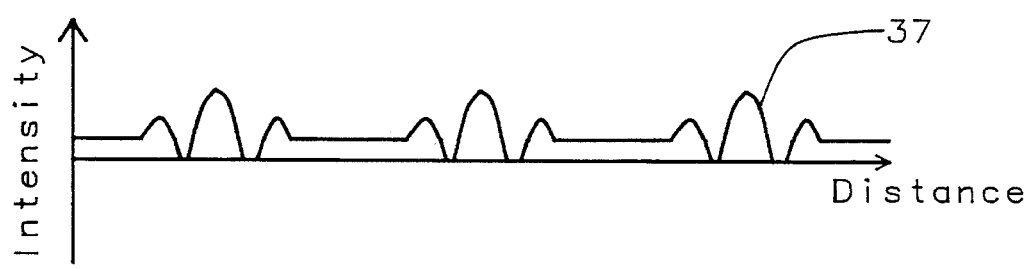
FIG. 3 shows the light intensity at the wafer.

Refer now more particularly to FIG. 1 through FIG. 3, there is shown an embodiment of the final structure of the mask and the effect on the light passing through the mask. As shown in FIG. 1 the mask is formed on a substrate of quartz 25 with thickness between about 1 millimeter and 6 millimeters. A patterned layer of partially transmitting chromium 27 with thickness of between about 100 and 500 Angstroms is formed on the substrate. A patterned layer of spin-on-glass with thickness of between about 3800 and 4200 Angstroms is formed over the patterned layer of partially transmitting chromium so that the pattern edges of the spin-on-glass extend beyond the pattern edges of the partially transmitting chromium.

The integrated circuit wafer is exposed by passing light through the phase shifting mask and onto the wafer. FIG. 2 shows the electric field of the light 35 as the light exits the mask. As shown in FIG. 2 the electric field of the light is both shifted in phase and partially attenuated by some parts of the mask, shifted in phase only by some parts of the mask, and neither shifted in phase nor attenuated by other parts of the mask. FIG. 3 shows the intensity of the light 37 at the surface of the wafer. The interaction of phase shifted and attenuated light, phase shifted light, and light which is neither phase shifted nor attenuated provides an extremely sharply defined intensity pattern at the wafer thereby producing improved image resolution.

Figure 4:
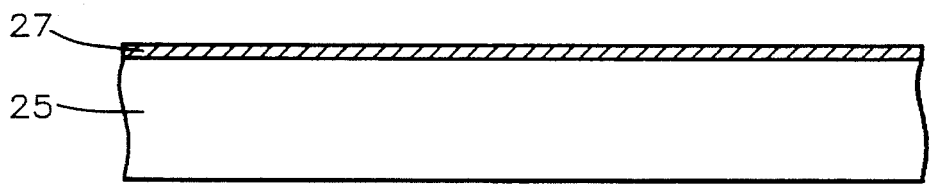
FIG. 4 shows a cross sectional view of the mask after the half-tone material has been deposited on the transparent substrate.

Refer now more particularly to FIG. 4 through FIG. 8, there is shown an embodiment of the method for forming the half-tone self-aligned phase shifting mask. As shown in FIG. 4 a layer of half-tone material of partially transmitting chromium 27 with thickness between about 100 and 500 Angstroms is deposited by sputtering chromium on a quartz substrate 25 having a thickness of between about 1 millimeter and 6 millimeters.

Figure 5:
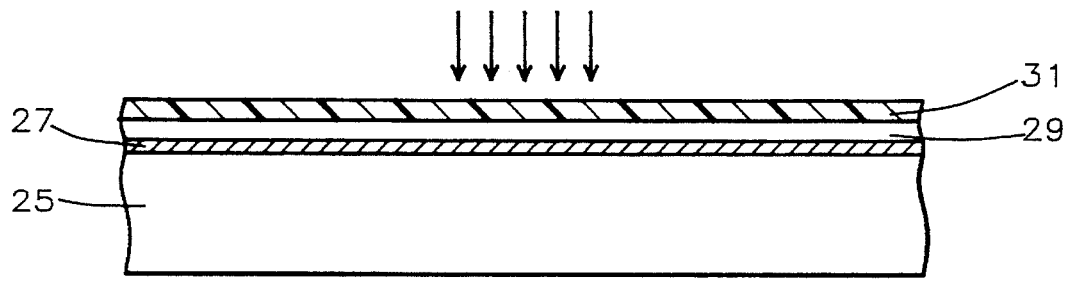
FIG. 5 shows a cross sectional view of the mask after the phase shifting material and photoresist have been deposited over the half-tone material.

As shown in FIG. 5 A layer of phase shifting material 29, such as spin-on-glass, with thickness of between about 3800 and 4200 Angstroms deposited by spin-on-glass methods is formed over the layer of partially transmitting chromium. A layer of photoresist 31 is deposited over the spin-on-glass and exposed.

Figure 6:
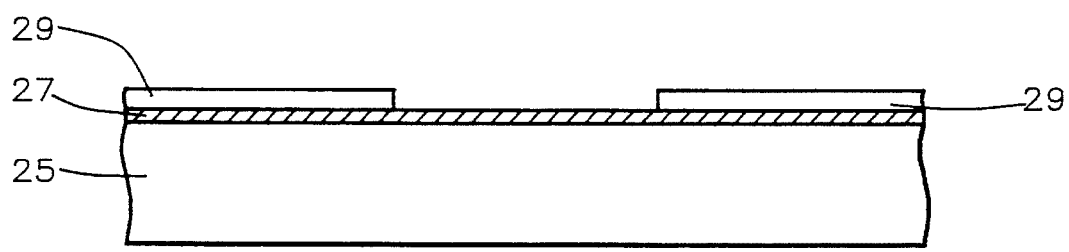
FIG. 6 shows a cross sectional view of the mask after the photoresist has been exposed and developed, the pattern has been etched in the phase shifting material, and the photoresist has been removed.
Figure 7:
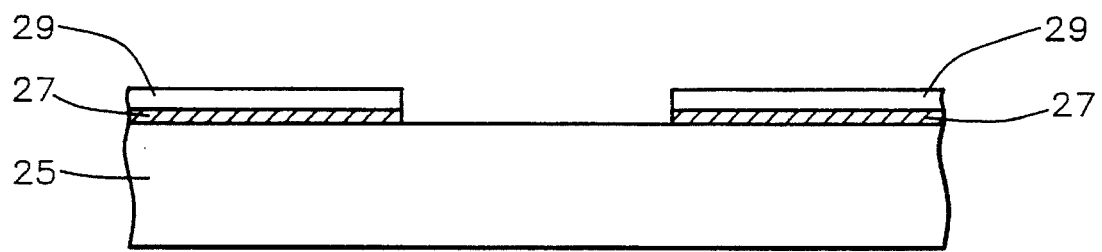
FIG. 7 shows a cross sectional view of the mask after the pattern has been etched in the half-tone material.
Figure 8:
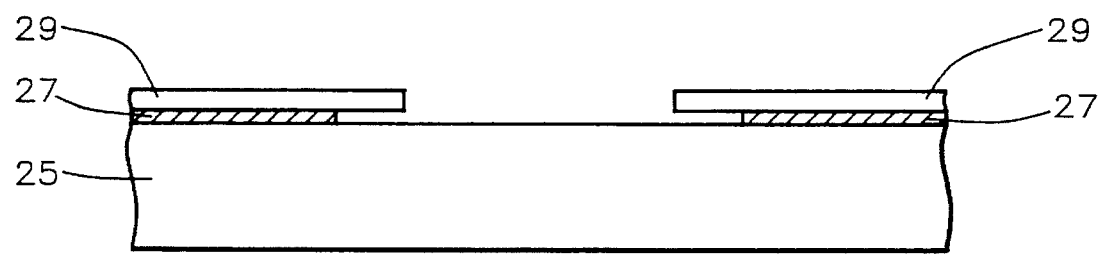
FIG. 8 shows a cross sectional view of the mask after the half-tone material has been over etched leaving phase shifting material overhanging the edge of the half-tone material.

As shown in FIG. 6 the photoresist is developed and the spin-on-glass 29 is etched to the desired pattern using reactive ion etching. The photoresist is then removed. As shown in FIG. 7 the pattern formed in the spin-on-glass is then etched in the partially transmitting chromium using the pattern formed in the spin-on-glass as a masks making the pattern self aligning and thereby further improving the image resolution. The partially transmitting chromium is etched using wet etching. As shown in FIG. 8 the partially transmitting chromium is then over etched so the pattern edges of the spin-on-glass extend beyond the pattern edges of the partially transmitting chromium by between about 500 to 2500 Angstroms.

Phase shifting techniques make use of light which has been shifted in phase by 180° interacting with non phase shifted light at pattern edges. This interaction creates an interference pattern which results in improved pattern definition at the pattern edges. In this invention the effects of the interaction between phase shifted and non phase shifted light are combined with the interaction of light which has been partially attenuated as well as phase shifted. This combination of phase shifted light, partially attenuated and phase shifted light, and non phase shifted light interact to provide better image resolution and depth of focus tolerance than can be achieved using the interaction of phase shifted and non phase shifted light alone.

While the invention has been particularly shown and described with reference to the preferred embodiments thereof, it will be understood by those skilled in the art that various changes in form and details may be made without departing from the spirit and scope of the invention.

What is claimed is:

1. A self aligning phase shifting mask, comprising:
   a substrate of transparent non phase shifting material;
   a patterned layer of half-tone or light attenuating material having pattern edges formed on said non phase shifting substrate; and
   a patterned layer of phase shifting material having pattern edges formed on said half-tone or light attenuating material wherein said pattern edges of said phase shifting material extend beyond said pattern edges of said half-tone or light attenuating material.

2. The mask of claim 1 wherein said substrate of transparent non phase shifting material is quartz having a thickness between about 1 and 6 millimeters.

3. The mask of claim 1 wherein said half-tone or light attenuating material is partially transmitting chromium having a thickness between about 100 and 500 Angstroms.

4. The mask of claim 1 wherein said phase shifting material is spin-on-glass.

5. The mask of claim 1 wherein said phase shifting material is silicon oxide deposited by means of chemical vapor deposition.

6. The mask of claim 1 wherein said phase shifting material silicon nitride.

7. The mask of claim 1 wherein the thickness of said phase shifting material is t=0.5 L/(n−1). (L=wavelength of light used, n=index of refraction of said phase shifting material)

8. The mask of claim 1 wherein said phase shifting material has a thickness between about 3800 and 4200 Angstroms.

9. The mask of claim 1 wherein said phase shifting material has a thickness between about 3000 and 6000 Angstroms.

10. The mask of claim 1 wherein said pattern edges of said patterned layer of phase shifting material extend beyond said pattern edges of said patterned layer of half-tone or light attenuating material by between about 500 and 2500 Angstroms thereby forming an interference pattern in light passing through said mask thereby the quality of images of said pattern formed by said light is improved.

11. A method of forming a self aligning phase shifting mask, comprising the steps of:
   providing a transparent substrate of non phase shifting material;
   forming a layer of half-tone or light attenuating material over said substrate of non phase shifting material;
   forming a layer of phase shifting material over said layer of said half-tone material;
   forming a layer of photoresist over said layer of phase shifting material;
   exposing and developing said photoresist layer to form a desired pattern with pattern edges;
   etching said desired pattern with pattern edges in said phase shifting material;
   removing said photoresist material;
   etching said desired pattern with pattern edges in said half-tone or light attenuating material using said pattern with pattern edges in said phase shifting material as a mask; and
   over etching said half-tone or light attenuating material so that said pattern edges of said pattern in said phase shifting material overhangs said pattern edges of said pattern in said half-tone or light attenuating material.

12. The method of claim 11 wherein said substrate of transparent non phase shifting material is quartz having a thickness between about 1 and 6 millimeters.

13. The method of claim 11 wherein said half-tone or light attenuating material is partially transmitting chromium having a thickness between about 100 and 500 Angstroms.

14. The method of claim 11 wherein said phase shifting material is spin-on-glass.

15. The method of claim 11 wherein said phase shifting material is silicon oxide deposited by means of chemical vapor deposition.

16. The method of claim 11 wherein said phase shifting material is silicon nitride.

17. The method of claim 11 wherein the thickness of said phase shifting material is t=0.5 L/(n−1). (L=wavelength of light used, n=index of refraction of said phase shifting material).

18. The method of claim 11 wherein said phase shifting material has a thickness between about 3800 and 4200 Angstroms.

19. The method of claim 11 wherein said phase shifting material has a thickness between about 3000 and 6000 Angstroms.

20. The method of claim 11 wherein said pattern edges of said pattern in said phase shifting material extend beyond said pattern edges of said pattern in said half-tone or light attenuating material by between about 500 and 2500 Angstroms thereby forming an interference pattern in light passing through said mask whereby the quality of images of said pattern formed by said light is improved.

\* \* \* \* \*